United States Patent [19]

Fehlner et al.

[11] Patent Number: 4,915,772
[45] Date of Patent: Apr. 10, 1990

[54] CAPPING LAYER FOR RECRYSTALLIZATION PROCESS

[75] Inventors: Francis P. Fehlner, Corning; Roger A. Miller, Painted Post; Arthur J. Whitman, Horseheads, all of N.Y.

[73] Assignee: Corning Incorporated, Corning, N.Y.

[21] Appl. No.: 913,998

[22] Filed: Oct. 1, 1986

[51] Int. Cl.$^4$ .............................................. C30B 13/00
[52] U.S. Cl. ................................ 156/620.7; 156/603; 156/624
[58] Field of Search .......... 156/603, 617 R, DIG. 73, 156/DIG. 105, 620.7, 624; 148/DIG. 15, DIG. 90, DIG. 81; 427/53.1, 93; 428/613, 448, 699, 701, 319.1, 631

[56] References Cited

U.S. PATENT DOCUMENTS

| | | | |
|---|---|---|---|
| 3,929,529 | 12/1974 | Poponiak | 148/DIG. 15 |
| 4,371,421 | 2/1983 | Fan et al. | 156/624 |
| 4,444,620 | 4/1984 | Kovacs et al. | 156/617 R |
| 4,461,670 | 7/1984 | Celler et al. | 156/603 |
| 4,497,683 | 2/1985 | Celler et al. | 156/603 |
| 4,536,251 | 8/1985 | Chiang et al. | 156/617 R |
| 4,565,599 | 1/1986 | Geis et al. | 156/603 |
| 4,590,130 | 5/1986 | Cline | 428/446 |
| 4,592,799 | 6/1986 | Hayafuji | 156/617 R |
| 4,632,723 | 12/1986 | Smith et al. | 156/617 R |

OTHER PUBLICATIONS

Rosler, R., "Low Pressure CVD Production Processes for Poly, Nitride, and Oxide", Solid State Technology, Apr., 1977, pp. 63-70.

Kingery et al., "Introduction to Ceramics", Wiley and Sons, 2nd Ed., pp. 520-522.

Pliskin et al., "Structural Evalatuion of Silicon Oxide Films", J. Electrochem. Soc., vol. 112, No. 10, 1965, pp. 1013-1019.

Pfeiffer et al., "Si-on-Insulator Films of High Crystal Perfection ... " Appl. Phys. Lett. 47(2) Jul. 15, 1985, 157-159.

Fan et al., "Graphite-Strip-Heater Zone-Melting Recrystallization of Si Films", J. Crys. Growth 63 (1983) 453-483.

Primary Examiner—John Doll
Assistant Examiner—R. Bruce Breneman
Attorney, Agent, or Firm—William J. Simmons

[57] ABSTRACT

An improved method for crystallizing amorphous or polycrystalline material is disclosed, which method employs a novel intermediate product. A film of material to be crystallized is formed on a substrate. A porous silica cap is formed over the film. The resultant intermediate product is heated to melt the film which crystallizes upon cooling. Gases generated during melting of the film escape through the porous cap which also functions to prevent deleterious agglomeration of the material while it is in a molten state.

3 Claims, 2 Drawing Sheets

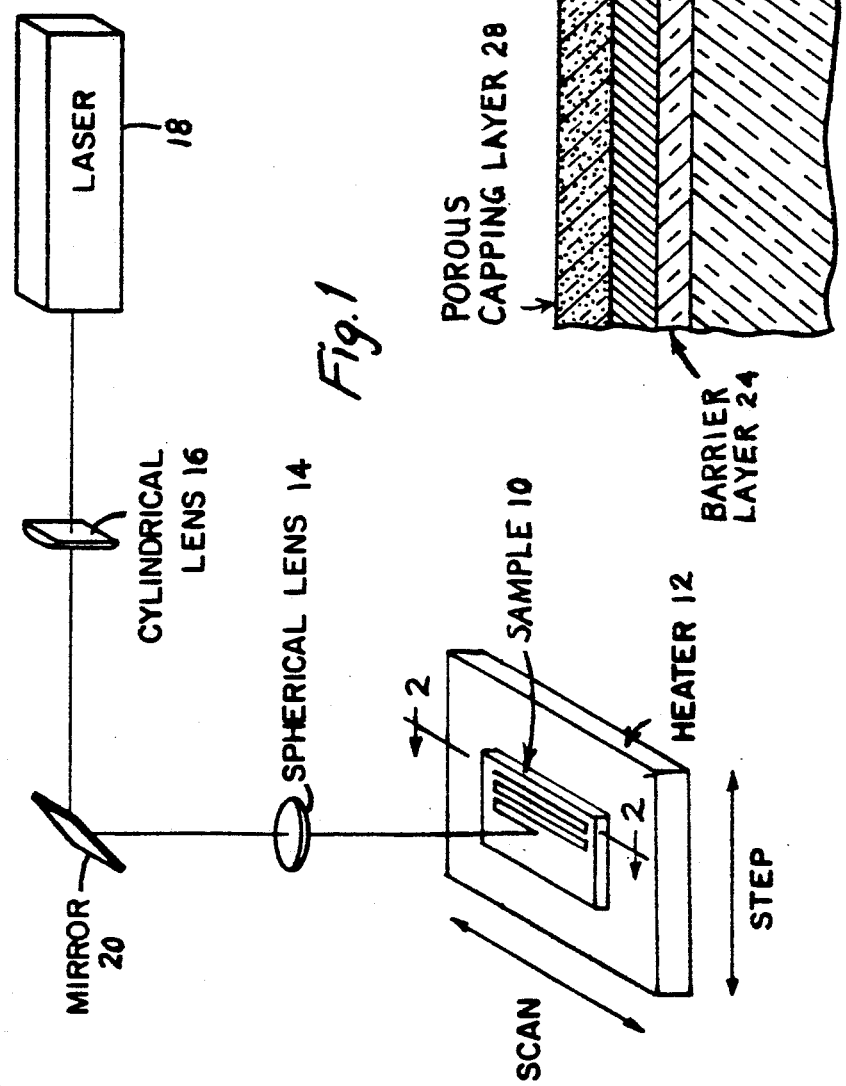

CAPPING LAYER FOR RECRYSTALLIZATION PROCESS

BACKGROUND OF THE INVENTION

The present invention relates to a method for producing a semiconductor device, and in particular, to a method for crystallizing a layer of semiconductive material on an insulating layer.

Since silicon is the most commonly employed material for use in crystallization/recrystallization processes, the term "silicon" will be used herein to describe processes wherein other semiconductive materials such as germanium, gallium arsenide and the like can be employed.

The terms "crystallizing" and "crystallization" are used herein to refer to both the process of heating an amorphous material to cause it to crystallize and the process of heating a polycrystalline material to cause it to recrystallize, since in both processes the material is crystallized from a molten state.

Silicon films on insulators can be used for producing large area device arrays suitable for flat-panel displays, dielectrically isolated devices for high-voltage and high-frequency integrated circuits, and other applications.

Silicon films have been produced by depositing on a suitable substrate amorphous or polycrystalline silicon in the form of a large area film or an array of islands. The silicon film is often formed as an island array when the resultant semiconductor devices are to be similarly spaced across the surface of the substrate. The entire silicon film or a portion thereof is subsequently heated by irradiation with a laser beam or other high-intensity light source to produce crystallization. Alternatively, the crystallization energy source has been an electron beam or a movable strip heater.

Silicon films have been formed on glass and fused silica substrates. By using glass substrates which approximate the thermal expansion of a deposited silicon film, thermal stress cracking during laser crystallization can be reduced or eliminated. Prior to depositing the silicon film on a glass substrate there is deposited thereon a barrier layer of refractory material. An ion barrier layer such as $Si_3N_4$ and/or an electron barrier layer such as $SiO_2$ can be employed. Such barrier layers are conventionally deposited by chemical vapor deposition (CVD) techniques. Various types of glass substrates are discussed in the publication by R. A. Lemons et al. entitled "Laser Crystallization of Si Films on Glass", Applied Physics Letters, Vol. 40, No. 6, 15 March 1982, Pages 469-471. This publication also indicates that the crazing of the silicon film due to a mismatch between fused quartz and silicon can be avoided by patterning the silicon films with narrow moats and small islands.

To prevent the silicon layer from agglomerating when it is melted, a capping layer is deposited on the surface thereof. As taught in U.S. Pat. No. 4,371,421, the capping layer may comprise a layer of $SiO_2$, for example, formed by a method such as CVD or thermal oxidation over the first applied amorphous or polycrystalline silicon film. That patent further teaches that an additional layer of silicon nitride ($Si_3N_4$) can be formed by a technique such as CVD over or under the silicon dioxide capping layer. The added $Si_3N_4$ layer appears to further enhance the wetting properties of the encapsulation layer as compared with a single layer of $SiO_2$. The thickness of the $SiO_2$ capping layer is usually between 0.5 and 2.0 μm. The $Si_3N_4$ layer may have a thickness of a few hundred Angstroms.

Large area silicon films which do not have capping layers can be crystallized without agglomeration thereof if process parameters such as laser power, scan rate, etc. are very carefully controlled. But such a method is not conducive to a commercial operation because of the tight process tolerances. In general, a capping layer is required for surface smoothness and integrity, especially when the silicon film is in the form of islands. Furthermore, thin silicon films tend to agglomerate more readily than thicker ones.

The publication by L. Pfeiffer et al. entitled "Si-On-Insulator Films of High Crystal Perfection by Zone Melting Under a $SiO_2$ Cap Provided with Vent Openings", Applied Physics Letters, Vol. 47, No. 2, 15 July 1985, pages 157-159, reports a marked improvement in the crystal perfection of zone melted thick (at least 15 μm) Si-on-insulator films that were prepared for melt processing by etching an array of openings in the $SiO_2$ capping layer. That publication theorizes that the improvement is due to the creation of venting paths that reduce the level of excess dissolved $SiO_2$ in the molten silicon before crystallization. The discrete vent openings of the Pfeiffer publication may cause the following disadvantages. If the vent dimensions are too large, silicon agglomeration may occur within a vent. The vented areas and the non-vented areas of the silicon film possess different optical properties. Furthermore, an extra photolithographic step is required to form the vents, thereby increasing the processing time and cost.

SUMMARY OF THE INVENTION

It is an object of the present invention to provide a method of crystallizing semiconductive films in such as manner that surface smoothness is adequate for the preparation of thin film transistors thereon. Another object is to provide such a method which is characterized by the venting of gases produced during crystallization of the film without forming discrete vents in the capping layer which lies over the semiconductive film.

This invention relates to a method of enhancing the surface smoothness of a film of semiconductive material which has been deposited on a surface of refractory material and thereafter crystallized. This method conventionally comprises the steps of depositing a capping layer of material over the film prior to crystallizing the film to prevent agglomeration of the film while it is in a molten state while the film is being crystallized. Heat is applied to the film while it is sandwiched between the capping layer and the refractory material surface to crystallize the film. The improvement of the present invention comprises depositing the capping layer under such conditions that it is sufficiently porous that gases generated while the film is being crystallized are vented through the pores of the capping layer.

The surface of refractory material can be either the surface of a suitable substrate or that of a barrier layer which has been formed on a substrate. By "refractory material" is meant one having a sufficiently high softening point temperature that it does not contaminate the semiconductive material during the crystallization process.

The step of depositing may comprise generating a vapor from a source and positioning the surface such that the vapor deposits on the film. The step of depositing may be carried out in oxygen whereby the vapor reacts with oxygen to form an oxide capping layer on the film. If the source comprises silicon and the step of depositing is carried out in oxygen, the silicon vapor reacts with oxygen to form an oxide of silicon on the film. The partial pressure of the oxygen in the deposition chamber is preferably sufficiently low that a silicon-rich porous capping layer is formed on the film. Both the silicon-rich nature and porous nature of the capping layer are expected to improve the wetting properties for molten silicon, thereby resulting in the formation of a smoother silicon film.

BRIEF DESCRIPTION OF THE DRAWINGS

FIG. 1 is a schematic illustration of an apparatus for crystallizing a semiconductive film.

FIG. 2 is a cross-sectional view of sample 10 taken at lines 2—2 of FIG. 1.

DESCRIPTION OF PREFERRED EMBODIMENTS

Figure 3:
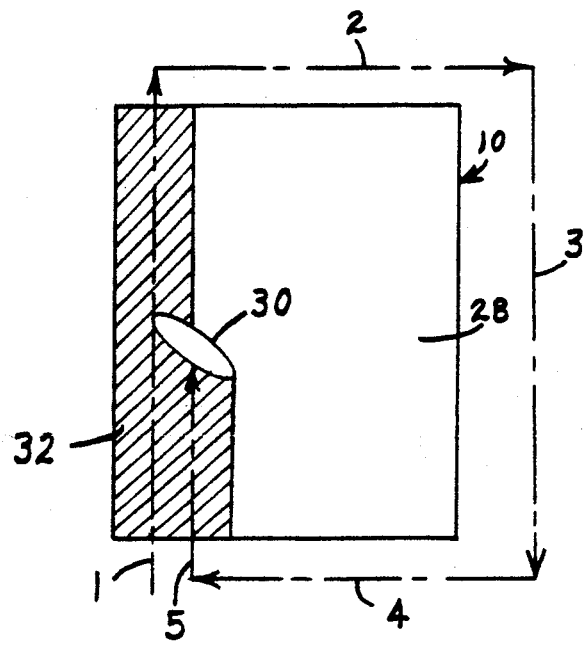
FIG. 3 is a schematic diagram of a unidirectional laser beam scanning pattern.

A schematic illustration of the laser crystallization system of the present invention is shown in FIG. 1. The sample 10 with the film 26 to be crystallized is mounted on a combination heater-sample holder 12. Heater 12 is usually a resistance heater which contacts the back of the sample. The use of heater 12 reduces the incident laser power needed to melt film 26 and thus initiate the desired crystallization process and reduces thermal gradients and thermal shock during that process. In the preferred embodiment for laser crystallization of silicon, the bias heating supplied by heater 12 is sufficient to maintain the front surface of the sample at a temperature between 300° C. and 500° C.

Heater-sample holder 12 is mounted on X-Y positioning tables (not shown) which allow the heated sample to be positioned and scanned beneath the focused laser beam. At fixed laser power, the shape, orientation, and power density of the focused beam normal to the sample surface can be controlled by the choice of lenses 14, 16 used to focus the beam. By "orientation" is meant the angle of the major axis of the elliptical spot of light on the film with respect to the direction of motion of the spot. Beam incidence can be either perpendicular or oblique with respect to the substrate surface. Instead of employing X-Y positioning tables, the sample could be held stationary while the laser beam scans across it.

FIG. 1 illustrates a cylindrical lens-spherical lens combination which gives an elliptically shaped focused spot. The laser beam may remain on the surface of sample 10 during a zig-zag scan which is illustrated in FIG. 1. The unidirectional scan scheme shown in FIG. 3 was employed in the specific example described below. As shown in FIG. 3, light spot 30 scans across the surface of sample 10 in a single direction. After crystallizing a portion of the semiconductive film during scan 1, the light spot 30 leaves sample 30 during scans 2, 3 and 4. Scan 5 again traverses the sample surface, overlapping a portion of the surface which was heated by scan 1. Cross-hatched region 32 represents that portion of the sample where crystallization has occurred.

The sample 10, which is shown in greater detail in FIG. 2, comprises a substrate 22 of fused silica, glass, ceramic, glass-ceramic, silicon or the like. Film 26 of amorphous or polycrystalline semiconductor material, such as silicon, can be formed directly upon the surface of a substrate if that substrate is formed of a suitable refractory material such as $SiO_2$. To minimize silicon-substrate interactions during that time of the crystallization process when molten silicon could lie directly on a nonrefractory substrate, a barrier layer 24 of a refractory material such as $SiO_2$, $Si_3N_4$, $Al_2O_3$ or $Si_2ON_2$ must be interposed between the silicon film and the substrate. A 1000Å–1500Å thick film of ion beam sputtered $Si_2ON_2$ or CVD-deposited $Si_3N_4$ is adequate to prevent an interaction. Such a barrier layer is also required to prevent any tramp alkali in the substrate from reaching the silicon during the deposition thereof, during crystallization, and/or during subsequent thin film transistor (TFT) fabrication. Further, to provide electronic isolation for the back surface of silicon TFT's, a $SiO_2$ layer must be interposed between the refractory barrier layer (eg, $Si_3N_4$) and the silicon film.

Glass compositions such as those disclosed in U.S. Pat. No. 4,180,618 are desirably employed as the substrate material since they have thermal expansion coefficients compatible with that of silicon. To prevent cracking of the silicon during crystallization due to thermal expansion mismatch, a $SiO_2$ barrier layer must be kept thin enough that the effective thermal expansion of the substrate-barrier layer combination is effectively that of the expansion compatible substrate rather than the relatively low expansion coefficient of $SiO_2$. The $SiO_2$ barrier layer thickness is therefore preferably about 1.0 μm or less.

Various well known techniques can be employed for the deposition of semiconductor film 26. Both fine grain polycrystalline CVD and amorphous E-beam evaporated silicon films have been crystallized by the method of the present invention. Other film deposition techniques such as sputtering should also be effective. Silicon film thicknesses are usually between 0.3 μm and 2.2 μm.

To minimize mass movement and prevent agglomeration of the molten semiconductor material during crystallization, encapsulation layers have been employed over the semiconductor film. Encapsulation layers have conventionally been formed of a refractory material such as $SiO_2$, $Si_3N_4$ or combinations thereof.

In accordance with the present invention, porous capping layer 28 is deposited under conditions which render it sufficiently porous that gases generated while the silicon film is being crystallized are vented through the open pores. Permeability of a porous ceramic body to gas flow drops off drastically when porosity is below 5–8% (see *Introduction to Ceramics* by , Kingery et al., 2nd edition, John Wiley & Sons, 1976 at pages 520–522). The porous capping layer must therefore have a density less than about 95% of theoretical density for such venting to occur. Suitable porous capping layers have been formed by reactive evaporation. Other techniques such as evaporation, rf sputtering, reactive rf sputtering, ion beam sputtering and reactive ion beam sputtering should also be effective for depositing the porous capping layer. When formed by reactive evaporation of silica at an oxygen pressure of $2 \times 10^{-4}$ Torr at a deposition rate of 2 °Å/sec, porous capping layer 28 was transparent with a slight blue cast. The porosity of the porous $SiO_2$ deposited by this technique was determined to be about 100 m$^2$/gram.

The capping layer must be deposited in sufficient thickness that it is continuous, i.e. it must cover the entire surface of the semiconductive film. A 0.4–2.0 μm thick porous layer of SiO$_2$ was found to be suitable for the laser crystallization of silicon. Even thicker capping layers could be employed if required to maintain surface smoothness. Other previously known refractory capping layer materials such as Si$_3$N$_4$ could be used alone or combined with SiO$_2$ as a mixture or a laminated structure. Other refractory materials which would not contaminate silicon with electrically active dopants could also form the porous capping layer; silicon carbide, yttrium oxide, and tantalum oxide are exemplary candidates. When employed in too great a thickness to transmit sufficient light energy to melt silicon, absorbing materials such as silicon carbide would still be useful for the capping layer if an alternative energy source such as an electron beam were used.

The laser power used for optimum crystallization must be determined experimentally for each new group of samples. This is done by subjecting a representative test sample to progressively higher laser powers, etching off the capping layer, and then etching the sample in a selective etchant (eg. Wright etch) followed by microscopically evaluating the state of crystallization produced at each power level. A description of Wright etch and a discussion of the use thereof to evaluate defects in silicon crystals are set forth in the publication, M.W. Jenkins, "*A New Preferential Etch for Defects in Silicon Crystals*", *J. Electrochemical Society: Solid State Science and Technology,* Vol. 124, No. 5, May 1977, pp 757–762. In general, the largest and most highly oriented crystal growth occurs for power levels just below the damage threshold of the film.

An elliptically-shaped beam is often employed in laser crystallization processes. The orientation of the major axis of the elliptically shaped laser beam on the sample surface may be varied by simply rotating the cylindrical lens about an axis defined by the incident laser beam.

The porous silica capping layer remained intact during laser crystallization, maintaining a smooth surface on the silicon film even in the absence of the wetting agent Si$_3$N$_4$. Surface profilometer traces were made on both as-deposited and laser crystallized silicon films, the latter for typical crystallization conditions of 10 watt laser power, 320 μm×25 μm elliptical beam (major axis at 45° to the scan direction), 500° C. bias temperature, 8 cm/sec scan rate, and 0.16 mm steps. The as-deposited silicon film in that process had an RMS surface roughness of 50Å while the laser crystallized film had an RMS roughness of 210Å. It is thought that the relative smoothness of the crystallized silicon film is due to the presence of a porous silica film thereon during laser crystallization.

Maintenance of surface smoothness is critical for the processing of thin film transistors. A laser crystallized film which was prepared by using the present capping layer has been successfully processed into working thin film transistors.

Figure 4:
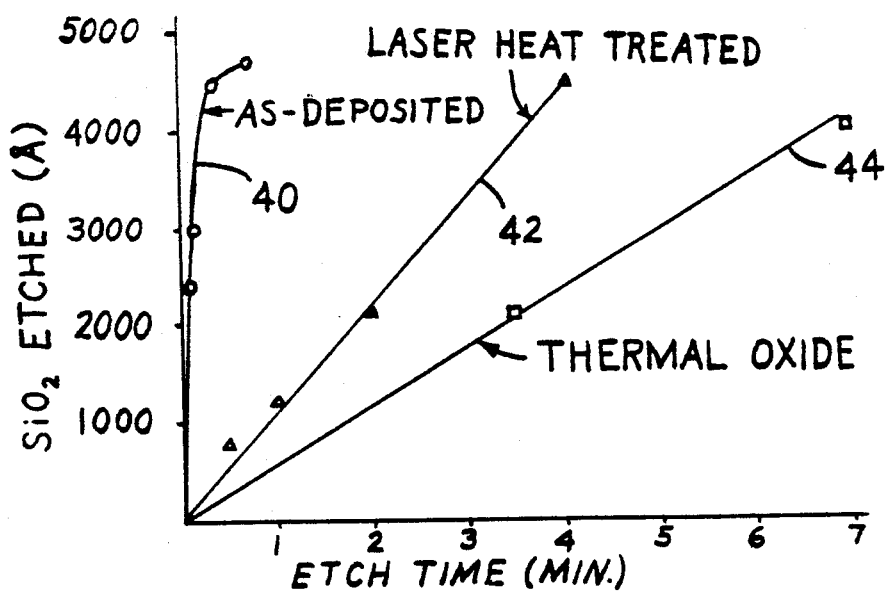
FIG. 4 is a graph illustrating the etch rate of various silica layers.

Removal of the capping layer can be accomplished by etching with buffered hydrofluoric acid, an acid that is used in the photolithographic process for the manufacture of semiconductor devices and integrated circuits. The graph of FIG. 4 illustrates the etch rates of various types of silica layers. Curve 40 shows the etch rate of the porous silica film of the present invention (formed by reactive evaporation of silica at an oxygen pressure of 2×10$^{-4}$ Torr at a deposition rate of 2 Å/sec). Curve 42 shows the etch rate of the above-mentioned porous silica film after laser crystallization. Curve 44 shows the etch rate of SiO$_2$ formed by thermal oxidation of silicon. A comparison of curves 40 and 44 reveals that the etch rate of the as-deposited porous SiO$_2$ layer is many times greater than that for conventional SiO$_2$ layers formed by thermal oxidation. However, a comparison of curves 40 and 42 reveals that the etch rate of the porous capping layer slows dramatically after laser crystallization has been carried out. These observations may be interpreted in terms of film porosity. Such porosity is well known in evaporated films (See for instance L. Holland, *Vacuum Deposition of Thin Films,* Chapman and Hall Ltd., London, 1966, pp 209, 220) and is apparently the cause of a 16% shrinkage in the thickness of capping layer 28 after a 10W laser treatment.

The method of the present invention possesses the following advantages. Deposition of the capping layer is a single step process; the previously employed Si$_3$N$_4$ wetting layer is not required. The pores of the capping layer provide a venting mechanism for gases generated during laser crystallization. Such venting is considered advantageous for obtaining improved smoothness and crystal quality during zone melting crystallization of silicon films. This beneficial venting effect is obtained without forming discrete vents by photolithography. The porous capping layer is more easily removed by HF than the prior non-porous composite layers which conventionally included Si$_3$N$_4$.

The orientation of silicon is important in MOS device technology where dislocation-free silicon is utilized, (100) silicon being preferred over (111) silicon because the surface state density of (100) silicon is three times lower. Orientation of the present laser crystallized silicon films was determined by XRD to be a preferred <111> orientation. This result differs from most published reports on laser crystallization in which <100> oriented silicon was found. However, the dislocation density is so high in laser crystallized silicon films that the factor of three in surface state density is obscured, and both orientations are equally useful for device fabrication.

In the following specific example, which is exemplary of the method of this invention, sample 10 was prepared as follows. Substrate 22 was a 1.0 mm thick sheet of an alkaline earth metal aluminosilicate glass consisting essentially, by weight, of about 66% SiO$_2$, 19% Al$_2$O$_3$, 9% BaO and 6% CaO. The glass contained less than 0.5% Cl which was introduced into the batch for fining. A 0.15 μm thick barrier layer of Si$_2$ON$_2$ was ion beam sputtered at about 1.0 Å/sec onto the substrate surface which was held at a temperature of 500° C. A 0.5 μm thick film of silicon was electron beam evaporated at about 20 Å/sec over the barrier layer at a pressure of 1.6×10$^{-6}$ Torr while the substrate was held at a temperature of 350° C. A porous capping layer of SiO$_2$ was reactively evaporated on the surface of the silicon which was maintained at a temperature of 350° C. With electron beam evaporated silicon as the cation source, the porous SiO$_2$ was deposited at a pressure of 2×10$^{-4}$ Torr oxygen. Deposition occurred at a rate of about 2 Å/sec until a 0.5 μm thick layer was formed. The substrate was stationary during the deposition of the Si$_2$ON$_2$ barrier layer. To improve thickness uniformity, it was rotated during the deposition of the silicon and the SiO$_2$ capping layer.

The sample was affixed to a combination heater/sample holder 12 which maintained the front surface of the sample at 500° C.

The samples were irradiated by an 8 watt CW argon ion laser operating in the 458–514 nm multiline mode. This radiation is readily absorbed by amorphous silicon and very fine grain polysilicon but not by the glass substrate. The laser output was focused onto the sample by a lens assembly comprising a 300 mm focal length cylindrical lens and an 85 mm focal length spherical lens, wherein the two lenses are separated by 820 mm. In this case the calculated laser beam size at the $1/e^2$ points for the resulting elliptically shaped beam, assuming a $TEM_{oo}$ mode and a wavelength of 514 nm, is $25\mu \times 310\mu$. Since the laser is used in the multiline mode with full aperture, however, higher order modes may also be present in the laser output, and this would tend to make the actual focused beam size larger than the calculated value.

The heated samples were scanned through the laser beam using electrically driven, programmable X-Y positioners, the X-scan rate of which was 8 cm/sec. The angle between the major beam axis and the scan direction was 45°. The Y-step width between X-scans was 0.12 mm. The unidirectional scan of FIG. 3 was employed. The Y-step was chosen so that each line overlaps the previous one by 30% to 50%.

The resulting silicon film showed a preferred (111) orientation as determined by x-ray diffraction. Optical microscopy (300X) was suggestive of low angle grain boundaries.

The following example, which resulted in the formation of islands of silicon, was similar to the previous example except for the noted differences. A laminated barrier layer of 0.15 $\mu$m CVD-deposited $Si_3N_4$ and 1.0 $\mu$m CVD-deposited $SiO_2$ was formed on a glass substrate having the previously identified composition. A 2.0 $\mu$m silicon film deposited by atmospheric pressure CVD was patterned by photolithographic techniques into islands ranging in size from 20 $\mu$m by 110 $\mu$m to 125 $\mu$m by 575 $\mu$m. A 0.5 $\mu$m porous capping layer of $SiO_2$ was deposited by reactive electron beam evaporation as described above. A 3 watt laser beam was scanned across the islands at 0.2 cm/sec. The laser beam was focused into two overlapping elliptical spots of 25 $\mu$m by 325 82 m, the centers of the ellipses being separated by 300 $\mu$m. Thus, a dumbell-shaped light spot encompassed the entire width of a silicon island during scanning. The angle between the major beam axis and scan direction was 90°. Substrate temperature was 500° C. Optical microscopy (300X) revealed that even the 125 $\mu M$ by 575 $\mu$m islands were single crystal (there were no visible grain boundaries after etching).

We claim:

1. A method of enhancing the surface smoothness of a film of semiconductive material which has been deposited on a surface of refractory material and thereafter crystallized, said method comprising the steps of
    depositing a capping layer over said film prior to crystallizing said film to prevent agglomeration of said film while it is in a molten state while said film is being crystallized, and
    applying heat to said film while it is sandwiched between said capping layer and said refractory material surface to crystallize said film,
wherein the step of depositing a capping layer comprises generating a vapor from a silicon source and positioning said substrate such that said vapor deposits on said film, the step of depositing being carried out in oxygen, whereby said vapor reacts with said oxygen to form an oxide of silicon, the partial pressure of said oxygen during the step of depositing being sufficiently low that a silicon-rich capping layer is formed, said capping layer being deposited under such conditions that it is sufficiently porous that gases generated while said film is being crystallized are vented through said capping layer.

2. A method of enhancing the surface smoothness of a film of semiconductive material which has been deposited on a surface of refractory material and thereafter crystallized, said method comprising the steps of
    depositing a capping layer over said film prior to crystallizing said film to prevent agglomeration of said film while it is in a molten state while said film is being crystallized, and
    applying heat to said film while it is sandwiched between said capping layer and said refractory material surface to crystallize said film,
wherein the step of depositing a capping layer comprises evaporating silicon from a source in the presence of oxygen and positioning said substrate such that said vapor deposits on said film and forms a $SiO_2$ capping layer having a thickness of at least 0.4 $\mu$m, said capping layer being deposited under such conditions that it is sufficiently porous that gases generated while said film is being crystallized are vented therethrough.

3. A method in accordance with claim 2 wherein the partial pressure of said oxygen during the step of depositing is sufficiently low that a silicon-rich capping layer is formed.

* * * * *